Aug. 8, 1961 J. H. WERNICK 2,995,613

SEMICONDUCTIVE MATERIALS EXHIBITING THERMOELECTRIC PROPERTIES

Filed July 13, 1959 5 Sheets-Sheet 1

INVENTOR
J. H. WERNICK
BY George S. Indig
ATTORNEY

INVENTOR
J. H. WERNICK
BY George S. Indig
ATTORNEY

Aug. 8, 1961 J. H. WERNICK 2,995,613

SEMICONDUCTIVE MATERIALS EXHIBITING THERMOELECTRIC PROPERTIES

Filed July 13, 1959 5 Sheets-Sheet 3

INVENTOR
J. H. WERNICK
BY George S. Indig
ATTORNEY

SEMICONDUCTIVE MATERIALS EXHIBITING THERMOELECTRIC PROPERTIES

Filed July 13, 1959 5 Sheets-Sheet 4

INVENTOR
J. H. WERNICK
BY George S. Indig
ATTORNEY

INVENTOR
J. H. WERNICK
BY George S. Indig
ATTORNEY

United States Patent Office 2,995,613

Patented Aug. 8, 1961

2,995,613
SEMICONDUCTIVE MATERIALS EXHIBITING THERMOELECTRIC PROPERTIES

Jack H. Wernick, Morristown, N.J., assignor to Bell Telephone Laboratories, Incorporated, New York, N.Y., a corporation of New York Filed July 13, 1959, Ser. No. 826,594
5 Claims. (Cl. 136—5)

This invention relates to semiconductive materials exhibiting thermoelectric properties and to devices utilizing these materials.

Although it has long been desired to make commercial use of Peltier heating and cooling, such use has not generally been realized chiefly by reason of limitations of semiconductive materials available. These materials can be characterized by a "figure of merit" which is dependent upon the thermoelectric power, thermal conductivity and electrical resistivity of the material. A high thermoelectric power, a low thermal conductivity and a low electrical resistivity give a good figure of merit. It has been determined that, for a given material, the thermoelectric power like the electrical resistivity of a material is a function of the level of n-type or p-type doping. Thermal conductivity, however, is relatively constant and is affected only little by such doping. A primary consideration in choosing a semiconductive material therefore is that the material exhibit a low thermal conductivity. To date, lead telluride and lead selenide have proven to be among the better common semiconductive materials. These compounds exhibit thermal conductivities in the order of 0.02 watt per centimeter per degree centigrade. Patent 2,811,570 teaches doping these compounds to obtain the optimum thermoelectric powers and electrical resistivity.

In accordance with the present invention it has been discovered that the thermoelectric properties of lead telluride and lead selenide can be improved by introducing certain ternary compounds into the crystalline lattice of these binary compounds. More specifically, it has been found that silver antimony telluride, silver antimony selenide and silver bismuth selenide form a complete series of solid solutions with lead telluride or lead selenide. These solutions exhibit thermal conductivities of the same magnitude as those of the ternary compounds, in the order of 0.01 watt per centimeter per degree centigrade or less up to inclusions of about 90 percent of binary constituent. In this compositional range the thermoelectric power level characteristic of the binary material is retained or even improved.

The invention may be more easily understood by reference to the drawings, in which.

Figure 4:
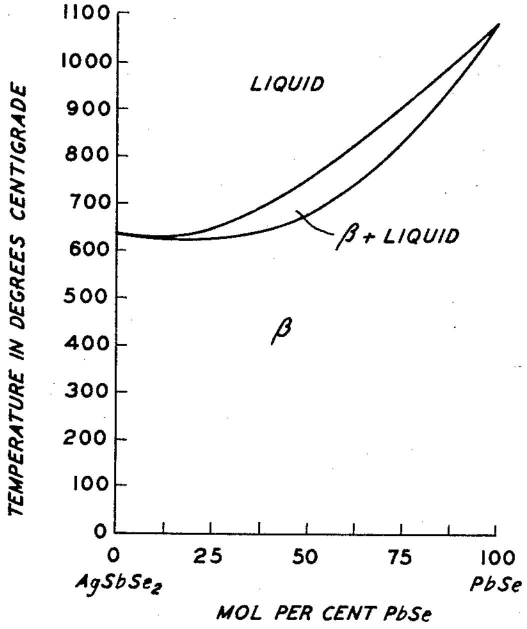
Figure 6:
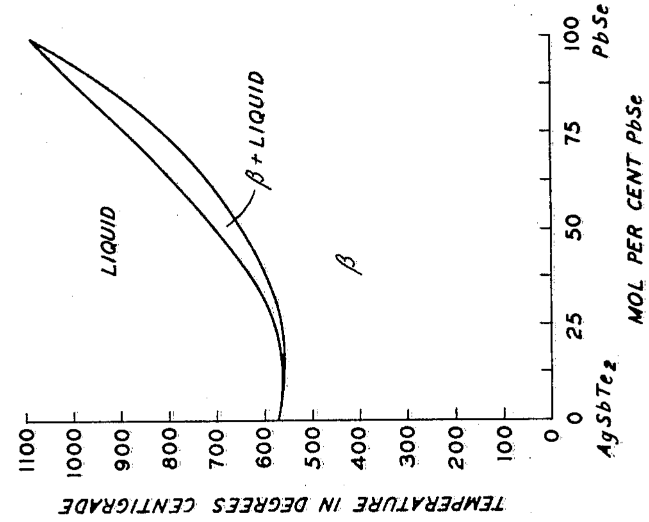
Figure 5:
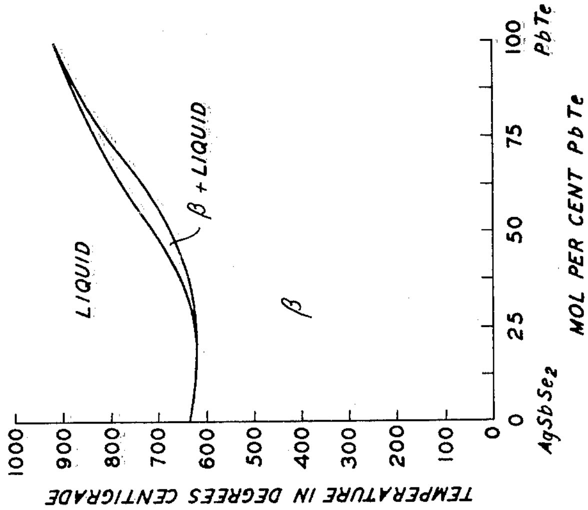
Figure 8:
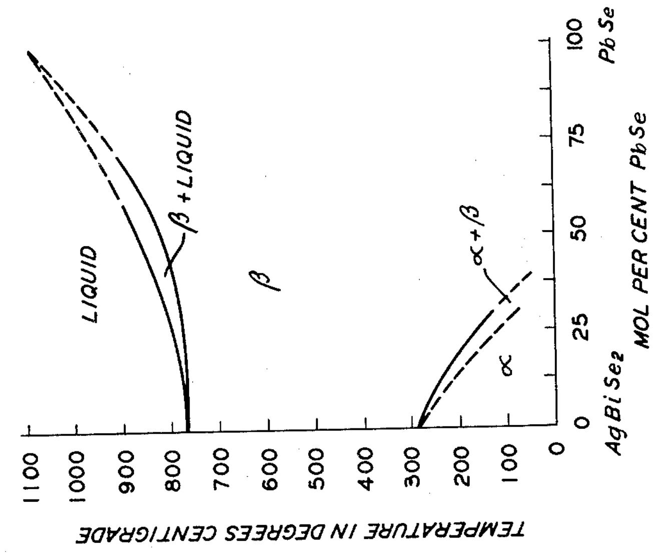
Figure 7:
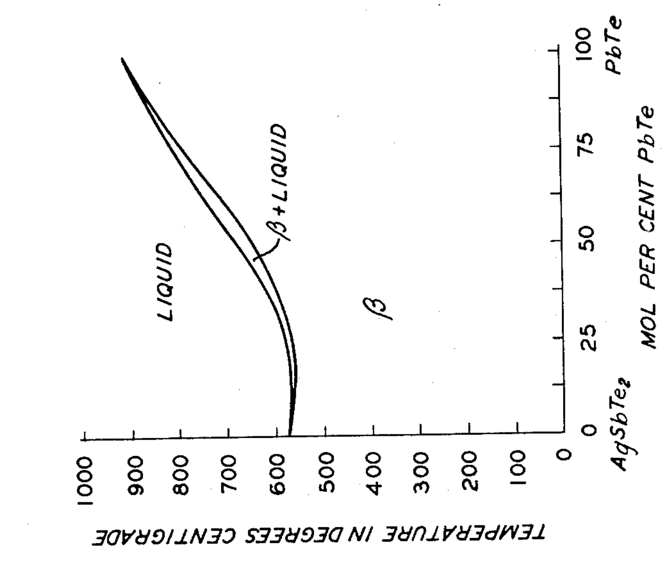
Figure 10:
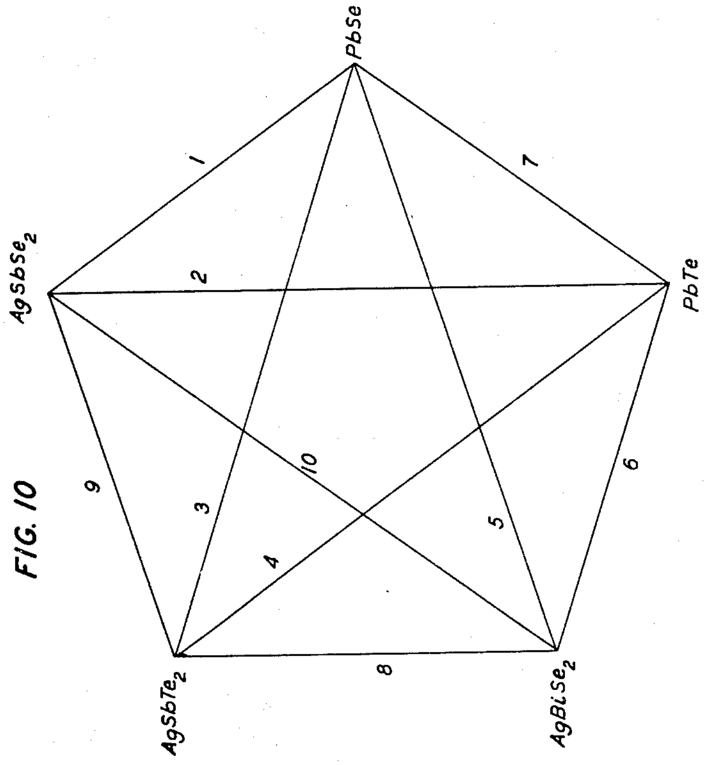
Figure 9:
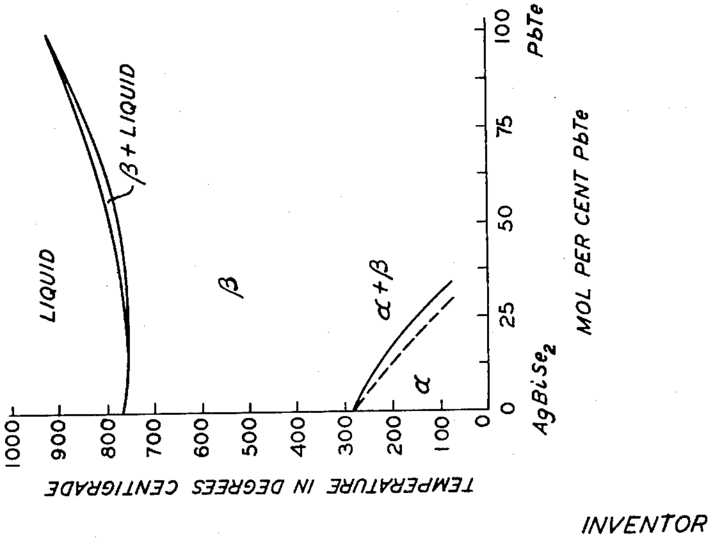

FIG. 4, plotted on coordinates of temperature versus mol percent lead selenide, is a phase diagram showing the lead selenide-silver antimony selenide system of the invention;

FIG. 5, plotted on coordinates of temperature versus mol percent lead telluride, is a phase diagram showing the lead telluride-silver antimony selenide system of the invention;

FIG. 6, plotted on coordinates of temperature versus mol percent lead selenide, is a phase diagram showing the silver antimony telluride-lead selenide system of the invention;

FIG. 7, plotted on coordinates of temperature versus mol percent lead telluride, is a phase diagram showing the silver antimony telluride-lead telluride system of the invention;

FIG. 8, plotted on coordinates of temperature versus mol percent lead selenide, is a phase diagram showing the silver bismuth selenide-lead selenide system of the invention;

FIG. 9, plotted on coordinates of temperature versus mol percent lead telluride, is a phase diagram showing the silver bismuth selenide-lead telluride system of the invention; and FIG. 10 is a quinary diagram on coordinates of mol percent showing the solid solution-forming regions of the constituents, lead selenide, lead telluride, silver bismuth selenide, silver antimony telluride and silver antimony selenide.

Figure 1:
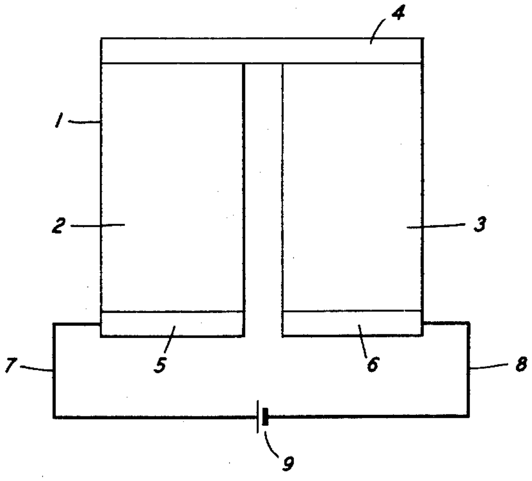
FIG. 1 is a schematic front elevational view of a thermoelectric device utilizing materials described herein.

Referring again to FIG. 1, the depicted thermoelectric device 1 consists of semiconductive blocks 2 and 3, metal bar 4 and electrode contacts 5 and 6. The circuit is completed by wires 7 and 8 and battery 9. Metal bar 4 and electrodes 5 and 6 make low resistance, essentially ohmic contact to blocks 2 and 3 by means, for example, of a solder joint. Either or both of blocks 2 and 3 may be formed of materials of the instant invention. For example, blocks 2 and 3 may be formed of an n-type lead telluride-silver antimony telluride solid solution and a p-type lead telluride-silver antimony telluride solid solution, respectively, of the instant invention. These blocks are typically three-quarters of an inch long and one-quarter of an inch square with a gap of approximately 0.1 inch between them. Bar 4 and electrodes 5 and 6 are approximately 0.05 inch thick. In a typical device 1, one to three volt battery 9 produces a current flow of about fifteen amperes which, for the circuit depicted, results in a counterclockwise electron flow. Peltier heating occurs at the junction of electrodes 5 and 6 and blocks 2 and 3. Peltier cooling occurs at the junction of bar 4 and blocks 2 and 3. A temperature drop of approximately 40° C. between the cool and hot junctions is typical for these measurements.

Exemplary device 1 utilizes two legs and dual heating and cooling junctions. The device can, of course, be operated by using a single leg. Schematically, this can be depicted by deleting block 2 and electrode 5 from device 1 and extending wire 7 to bar 4 contacting a surface of block 3 opposite electrode 6.

Figure 2:
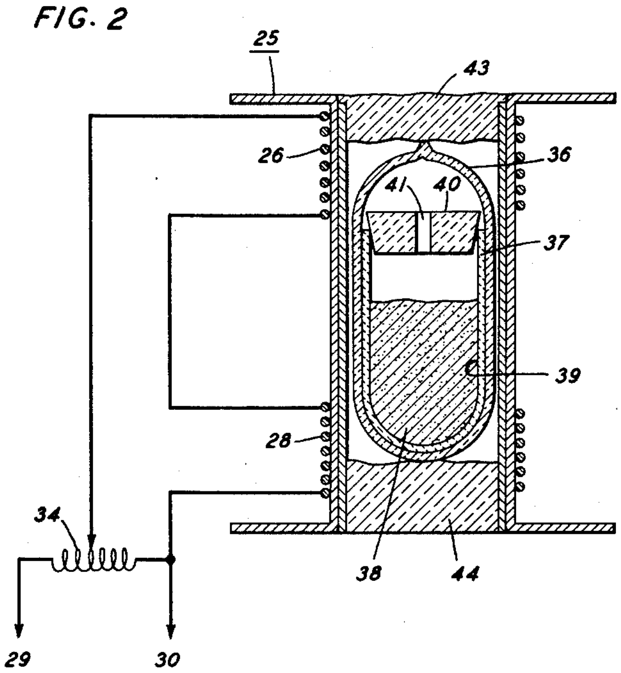
FIG. 2 is a schematic cross-sectional view of apparatus suitable for use in the preparation of the materials of the invention.

FIG. 2 depicts one type of apparatus found suitable for the preparation of the materials of the instant invention. Reference is made to this figure in the examples related to the actual preparation of these materials. The apparatus of this figure consists of a resistance wire furnace 25 containing two individual high resistance windings 26 and 28. These windings are turns of, for example, platinum-20 percent rhodium resistance wire. In operation an electrical potential is applied across terminals 29 and 30 by means not shown. The amount of current supplied to windings 26 and 28 is controlled by auto-transformer 34. Within furnace 25 there is contained sealed container 36 having an inside diameter in the order of, for example, 19 millimeters within which there is sealed a second crucible 37 containing the ingredients 38 used in the synthesis of a material of this invention. Containers 36 and 37 are inert with respect to the ingredients under the processing conditions. Silica containers have been found to be satisfactory. Container 36 completely encloses container 37 thereby preventing possible loss by vaporization of the component materials during processing. Crucible 37 may preferably have a coating 39 of, for example, carbon on its inside surface to reduce adhesion between crucible 37 and the final material. Inner crucible 37 is closed at its upper end with an inert cap 40, for example, made of graphite having venting hole 41 which permits the equalization of pressure in containers 36 and 37. Cap 40 minimizes possible boiling over into the container 36 of the component materials 38 during processing. Further, cap 40 minimizes heating of materials 38 during the sealing off of container 36, which might cause some volatilization and accompanying loss of the materials 38. Vaporization losses by condensation during processing are minimized by use of insulation layers 43 and 44 made of a refractory silicate such as Sil-o-cell refractory.

The following is a general outline of a method of preparation used in the synthesis of the materials of the invention. Reference is had to this general outline in the specific examples each of which sets forth specific stated materials and conditions of processing utilized in the preparation of the materials of the invention.

Inner surface of crucible 37 is coated with a carbon layer 39 by exposing the crucible to a mixture of four parts of nitrogen and one part of methane for a period of fifteen minutes and a flow rate of approximately 250 cubic centimeters per minute with the crucible at a temperature of about 1000° C. The nitrogen gas aids in the formation of a uniformly thin carbon layer. After cooling, the component materials 38 are placed in crucible 37 which is then stoppered with cap 40 and placed within container 36. Outer container 36 is then evacuated, filled with tank nitrogen at a pressure of two-thirds of an atmosphere, sealed and placed within furnace 25. The nitrogen atmosphere aids in retarding volatilization of the initial components. The partial vacuum inside crucible 36 aids in the sealing of the top of the crucible by causing it to collapse inwardly and come together when the crucible is heated in this region. An electrical potential is then applied across terminals 29 and 30 and auto-transformer 34 is adjusted so as to result in furnace temperature within windings 26 and 28 of about 1125° C. This temperature is arbitrary and is dependent only upon the temperature required to melt component materials 38. For example, lead selenide which has the highest melting point of any of the constituent materials of the instant invention melts at approximately 1080° C. Temperatures higher than 1125° C. are limited only by economic conditions and furnace capabilities. Since the terminal portions of the furnace are at a hotter temperature than the central portion, dynamic loss by vaporization and condensation of the component materials 38 is prevented.

Heating of the furnace is gradual, taking about four hours from room temperature to the high temperature of 1125° C. so that the major portion of the alloying is carried out over a range of temperature at which the vaporization pressure of the component materials is relatively low thereby minimizing loss. After the high temperature is achieved, heating is continued for four hours to insure adequate mixing and diffusion of the reactants which in turn insures a homogeneous end product. The melt is then permitted to furnace cool to room temperature. Since thermoelectric devices in general use polycrystalline materials, the rate of cooling is not critical. Resort need not be had to slow cooling rates to obtain single crystals. From this standpoint there is no objection to turning off the furnace power and allowing the melt to cool naturally or removing the melt from the furnace and rapidly cooling it.

Specific examples of materials of the present invention formed by the above-described process follow. In all of the examples it was found that particle size of stated constituents was not critical. Actual particle size varied from about 0.1 inch to about 0.5 inch. Microscopic examination, X-ray analysis and thermal analysis showed that these materials were single phase.

EXAMPLE 1

A solid solution having formula expressed in mol percent $(AgSbTe_2)_{0.5}(PbTe)_{0.5}$ was prepared in accordance with the above outline using a mixture of 10.79 grams of silver, 12.18 grams of antimony, 38.28 grams of tellurium and 20.22 grams of lead. These materials were thoroughly mixed before being placed in crucible 37.

EXAMPLE 2

A solid solution having formula $(AgSbTe_2)_{0.5}(PbSe)_{0.5}$ was prepared as above using a mixture of 8.09 grams of silver, 9.13 grams of antimony, 19.4 grams of tellurium, 15.54 grams of lead and 5.92 grams of selenium.

EXAMPLE 3

A solid solution having formula $$(AgSbSe_2)_{0.75}(PbTe)_{0.25}$$

was prepared as above using a mixture of 12.14 grams of silver, 13.70 grams of antimony, 17.77 grams of selenium, 7.77 grams of lead and 4.79 grams of tellurium.

EXAMPLE 4

A solid solution having formula $(AgSbSe_2)_{0.5}(PbSe)_{0.5}$ was prepared as above using a mixture of 10.9 grams of silver, 12.18 grams of antimony, 23.69 grams of selenium and 20.72 grams of lead.

EXAMPLE 5

A solid solution having formula $(AgBiSe_2)_{0.5}(PbTe)_{0.5}$ was prepared as above using a mixture of 10.79 grams of silver, 20.09 grams of bismuth, 15.79 grams of selenium, 20.72 grams of lead and 12.76 grams of tellurium. This material exhibits a thermal conductivity of 0.006 watt per centimeter per degree centigrade.

EXAMPLE 6

A solid solution having formula $$(AgBiSe_2)_{0.25}(PbSe)_{0.75}$$

was prepared as above using a mixture of 5.39 grams of silver, 10.45 grams of bismuth, 19.74 grams of selenium and 31.08 grams of lead.

Thermoelectric measurements made on the materials of Examples 1–6 and other materials of the present invention are listed in Table I. Values for the binary materials herein discussed are indicated, not as part of the invention, but for comparative purposes. As can be seen, certain of these materials exhibit thermoelectric powers higher than those of the binary and ternary end components.

*Table I*

| | Thermoelectric power |
|---|---|
| $(AgSbTe_2)_{0.9}(PbTe)_{0.1}$ | +200 |
| $AgSbTe_2)_{0.75}(PbTe)_{0.25}$ | +300 |
| $(AgSbTe_2)_{0.5}(PbTe)_{0.5}$ | +375 |
| $(AgSbTe_2)_{0.9}(PbSe)_{0.1}$ | +250 |
| $(AgSbTe_2)_{0.75}(PbSe)_{0.25}$ | +310 |
| $(AgSbTe_2)_{0.5}(PbSe)_{0.5}$ | +250 |
| $(AgSbSe_2)_{0.9}(PbTe)_{0.1}$ | +300 |
| $(AgSbSe_2)_{0.5}(PbTe)_{0.5}$ | +300 |
| $(AgSbSe_2)_{0.25}(PbTe)_{0.75}$ | +300 |
| $(AgSbSe_2)_{0.75}(PbSe)_{0.25}$ | +300 |
| $(AgSbSe_2)_{0.5}(PbSe)_{0.5}$ | +350 |
| $(AgSbSe_2)_{0.25}(PbSe)_{0.75}$ | +300 |
| $(AgBiSe_2)_{0.9}(PbTe)_{0.1}$ | —140 |
| $(AgBiSe_2)_{0.75}(PbTe)_{0.25}$ | —400 |
| $(AgBiSe_2)_{0.5}(PbTe)_{0.5}$ | —100 |
| $(AgBiSe_2)_{0.9}(PbSe)_{0.1}$ | —150 |
| $(AgBiSe_2)_{0.25}(PbSe)_{0.75}$ | —200 |
| $AgSbTe_2$ | +280 |
| $AgSbSe_2$ | +250 |
| $AgBiSe_2$ | —100 |
| PbTe | +150 —200 |
| PbSe | —288 |

Figure 3:
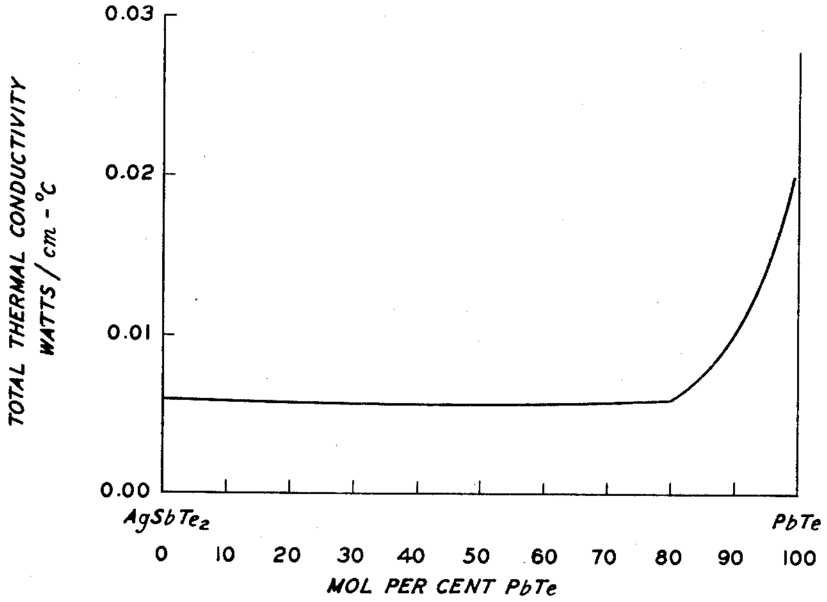
FIG. 3 is a plot of thermal conductivity versus composition for binary-ternary solid solutions in accordance with the invention which illustrates the relationship between the concentration of the binary component and the thermal conductivity of the solid solution.

FIG. 3 depicts a plot of thermal conductivity versus lead telluride concentration for a typical material of the invention, a silver antimony telluride-lead telluride solid solution. Lead telluride and lead selenide exhibit thermal conductivities in the order of 0.02 watt per centimeter per degree centigrade. Silver antimony telluride, typical of the ternary compounds herein discussed, exhibits a thermal conductivity in the order of 0.006 watt per centimeter per degree centigrade. As is shown by this figure, inclusions of as little as ten percent of the ternary compound in the binary compound result in a fifty percent decrease in the thermal conductivity of the binary compound. Such inclusion constitutes a preferred range of the ternary-binary solid solutions of the instant invention. It is further seen that the thermal conductivity of the ternary compound is substantially retained with as little as twenty percent inclusion of the ternary into the binary component. Such inclusion therefore constitutes an optimum composition range for the ternary-binary solid solutions of the invention. In general, inclusions of five percent binary compound in the ternary compound result in a lattice constant measurably different from the pure ternary. A preferred solid solution composition of the invention therefore includes from five to ninety percent of the binary compound. An optimum composition includes from five to eightly percent of the binary compound.

FIGS. 4, 5, 6, 7, 8 and 9 are phase diagrams of materials of the present invention. Differential thermal analyses were made to determine the liquidus, solidus and solid state transformation temperatures. These diagrams show that the materials herein contemplated are single phase solid solutions, the high temperature forms of which have the disordered sodium chloride type structure, designated beta. For the silver antimony selenide-lead selenide, silver antimony selenide-lead telluride, silver antimony telluride-lead selenide, silver antimony telluride-lead telluride solid solutions of FIGS. 4, 5, 6, and 7, this structure persists down to room temperature. In the case of the silver bismuth selenide-lead selenide and silver bismuth selenide-lead telluride solid solutions of FIGS. 8 and 9, there is a thermal arrest at 280° C. in cooling from the high temperature beta structure. At this temperature, transition is to an ordered rhombohedral structure which at about 120° C. transforms to a hexagonal structure, designated alpha.

FIG. 10 is a plot showing the solid solution-forming regions of the binary and ternary compounds herein discussed. It has previously been shown that the compounds connected by legs 1 through 6 form a complete series of solid solutions. The compounds connected by legs 8, 9 and 10 are known to form a complete series of solid solutions; see Journal of Physics and Chemistry of Solids, 1958, volume 7, Nos. 2–3, pages 240–248. A. Ioffe in the article "Semiconductor Thermoelements and Thermoelectric Cooling" in Infosearch Ltd., London, 1957, has shown that the compounds connected by leg 7 form a complete series of solid solutions. Therefore, thermodynamics dictates that a solid solution is present anywhere in this quinary system. As previously discussed, all of the ternary materials of the present invention exhibit the same magnitude of thermal conductivity. Further, the binary compounds exhibit a higher characteristic magnitude of thermal conductivity. On this basis, FIG. 3 is considered exemplary of any of the systems of FIG. 10. As such, the scope of the instant invention is not limited to any particular ternary-binary solid solution but rather includes any of the solid solution systems of FIG. 10.

In accordance with conventional doping theory, the extrinsic semiconductive properties of any one of the materials herein disclosed may be changed by doping in accordance with accepted doping procedure. For example, the conductivity type of any of the materials of the instant invention may be caused to approach n-type by substitution of any one of the elements of the material by any element having a larger number of electrons in its outer ring. Further, the conductivity type may be caused to approach p-type by substitution with an element having a smaller number of electrons in its outer ring.

In common wtih experience gained from studies on other semiconductor systems, the addition of nonsignificant impurities in amounts over one percent and significant impurities over 0.01 percent by weight tends toward degenerate behavior. However, in thermoelectric devices semidegenerate behavior is desirable. Therefore the materials of the invention are considered operative at levels of 0.1 percent significant impurity and higher.

What is claimed is:

1. A homogeneous semiconductive composition consisting essentially of at least about 5 mol percent to about 90 mol percent of one binary compound selected from the group consisting of lead telluride and lead selenide, remainder at least one ternary compound selected from the group consisting of silver antimony telluride, silver antimony selenide and silver bismuth selenide.

2. A semiconductive composition in accordance with claim 1 consisting essentially of about 5 mol percent to about 80 mol percent of at least one of said binary compounds.

3. A semiconductive material in accordance with claim 1 wherein said binary compound is lead telluride and said ternary compound is silver antimony telluride.

4. A thermoelectric device comprising a first element having a composition consisting essentially of at least from about 5 mol percent to about 90 mol percent of one binary compound selected from the group consisting of lead telluride and lead selenide, remainder at least one ternary compound selected from the group consisting of silver antimony telluride, silver antimony selenide and silver bismuth selenide, said composition forming a low resistance, essentially ohmic junction with another element having a different conductivity mechanism.

5. A thermoelectric device in accordance with claim 4 wherein said composition consists essentially of about 5 mol percent to about 80 mol percent of at least one of said binary compounds selected from the group consisting of lead telluride and lead selenide.

References Cited in the file of this patent

UNITED STATES PATENTS

| | | |
|---|---|---|
| 2,811,570 | Karrer | Oct. 29, 1957 |
| 2,882,468 | Wernick | Apr. 14, 1959 |